US012142339B2

(12) United States Patent
Merritt (10) Patent No.: US 12,142,339 B2
(45) Date of Patent: Nov. 12, 2024

(54) IMPLEMENTING FAULT ISOLATION IN DRAM

(71) Applicant: Microsoft Technology Licensing, LLC, Redmond, WA (US)

(72) Inventor: Todd Alan Merritt, Boise, ID (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 178 days.

(21) Appl. No.: 17/926,086

(22) PCT Filed: May 21, 2021

(86) PCT No.: PCT/US2021/033684
§ 371 (c)(1),
(2) Date: Nov. 17, 2022

(87) PCT Pub. No.: WO2021/237106
PCT Pub. Date: Nov. 25, 2021

(65) Prior Publication Data
US 2023/0187012 A1    Jun. 15, 2023

(30) Foreign Application Priority Data

May 22, 2020   (NL) ...................................... 2025650

(51) Int. Cl.
*G11C 29/52*     (2006.01)
*G11C 11/408*    (2006.01)
*G11C 11/4096*   (2006.01)

(52) U.S. Cl.
CPC .......... *G11C 29/52* (2013.01); *G11C 11/4085* (2013.01); *G11C 11/4096* (2013.01)

(58) Field of Classification Search
CPC . G11C 29/52; G11C 11/4085; G11C 11/4096; G11C 11/4093; G11C 5/04;
(Continued)

(56) References Cited

U.S. PATENT DOCUMENTS 5,048,022 A   9/1991  Bissett et al.
6,519,736 B1  2/2003  Chen et al.
(Continued)

OTHER PUBLICATIONS

"International Search Report and Written Opinion Issued in Netherland Application No. N2025650", Mailed Date: Mar. 11, 2021, 11 Pages.
(Continued)

*Primary Examiner* — Ajay Ojha
(74) *Attorney, Agent, or Firm* — Ray Quinney & Nebeker; James Bullough (57) ABSTRACT

The present disclosure relates to systems, methods, and computer readable media for implementing fault isolation in memory without incurring a die size penalty. For example, systems disclosed herein may involve identifying row addresses for sub-word line drivers accessing data from a memory block (e.g., a dynamic random-access memory (DRAM) block of memory). The systems disclosed herein may further serialize or otherwise compile bit rows into a prefetch bit including a pattern of bits. In generating the prefetch bit, the systems described herein may selectively group bits of data into respective regions that enable an error correction scheme to be applied to the pattern of data while minimizing a likelihood of uncorrectable errors within the prefetch bit.

20 Claims, 6 Drawing Sheets

(58) Field of Classification Search
CPC . G11C 8/08; G11C 2029/0411; G11C 7/1006; G11C 7/1012
See application file for complete search history.

(56) References Cited

U.S. PATENT DOCUMENTS

| | | |
|---|---|---|
| 7,089,461 B2 | 8/2006 | Gilbert et al. |
| 7,124,213 B2 | 10/2006 | Cochran et al. |
| 10,235,242 B2 | 3/2019 | Wright et al. |
| 10,393,801 B2 | 8/2019 | Wang et al. |
| 2004/0225944 A1 | 11/2004 | Brueggen |
| 2006/0230329 A1 | 10/2006 | Tayler |
| 2012/0066560 A1 | 3/2012 | Chuang et al. |
| 2016/0284424 A1* | 9/2016 | Das .................. G06F 3/0619 |
| 2020/0133769 A1 | 4/2020 | Bains |

OTHER PUBLICATIONS

Patel, et al., "Understanding and Modeling On-Die Error Correction in Modern DRAM: An Experimental Study Using Real Devices", In Proceedings of 49th Annual IEEE/IFIP International Conference on Dependable Systems and Networks, Jun. 24, 2019, pp. 13-25.
"International Search Report and Written Opinion Issued in PCT Application No. PCT/US21/033684", Mailed Date: Sep. 23, 2021, 11 Pages.

* cited by examiner

IMPLEMENTING FAULT ISOLATION IN DRAM

BACKGROUND

Recent years have seen a precipitous rise in the use of computing devices (e.g., mobile devices, personal computers, server devices, cloud computing systems) to receive, store, transmit, process, or otherwise utilize digital data. For example, it is now common for individuals and businesses to store and/or process large quantities of data on local computing devices and/or on remote cloud computing systems. Indeed, as demand for increased storage and memory capacity on computing devices increases, innovations in technology associated with increasing access speed and memory capacity has also increased.

As demand for enhanced memory performance continues to grow, conventional techniques for improving performance of memory systems suffer from a number of difficulties and drawbacks. For example, while many computing systems can boost memory performance by simply adding additional memory modules and other memory hardware, adding memory hardware to new and existing systems often becomes cost prohibitive. Indeed, where server devices include massive quantities of memory, adding additional memory hardware to hundreds or thousands of server devices can increase costs associated with manufacturing and purchasing hardware in addition to costs as a result of increased power consumption.

In addition to increased costs, adding memory hardware may be difficult in environments with limited hardware real estate. In particular, where consumer demand often requires increased performance within smaller devices, increasing memory performance by way of adding new hardware is often not a viable option. As a result, computing devices having limited space often suffer from decreased performance (or increased costs) as a result of having limited space within which hardware may be implemented.

Moreover, and as will be discussed in further detail below, conventional memory systems often implement error correction components to ensure that data maintained on memory systems is accurate. However, techniques for calculating errors within units of memory are often limited to memory blocks having specific formats. For example, some error correction components are currently limited to performing error correction on data having a ×4 format (e.g., input/output (I/O interfaces having a width of four bits). As a result, attempting to perform error correction on data having different formats (e.g., ×8 or ×16 formats) often result in uncorrectable errors that cause one or more systems or subsystems of computing devices to fail.

These and other problems exist with regard to increasing memory performance and error correction on computing devices.

DETAILED DESCRIPTION

The present disclosure is generally related to implementing fault isolation in memory without incurring a die size penalty. In particular, in one or more embodiments described herein, the present disclosure relates to techniques for accessing data from dynamic random access memory (DRAM) and compiling the data in such a way that errors within prefetch bits can be corrected using error-correcting code (ECC) memory. As will be discussed in further detail below, the present disclosure implements features and functionality that enable correcting sub-word line errors even where an input/output (I/O) interface for a DRAM block includes an eight-bit wide port resulting in 8×8 bits of data and where a correction scheme is specifically configured to implement error correction on four-bit wide data arrays.

For example, a computing device may include a memory system having a plurality of memory blocks (e.g., DRAM blocks) on a memory module (e.g., a dual in-line memory module (DIMM)). The memory module may further include an error correction code (ECC) memory block for use in implementing a correction scheme to detect and fix correctable errors on data accessed from memory blocks of the memory module. The memory system may further include sub-word line drivers implemented within the respective memory blocks capable of reading, writing, or otherwise accessing data on the memory blocks.

As will be discussed in further detail herein, a computing device may include a memory error correction system for implementing features and functionality of one or more embodiments described herein. For instance, the memory error correction system may access bit rows from nodes of a memory block associated with an ECC memory capable of generating error correction code to be used in calculating and fixing bit errors within prefetch bits generated by the memory error correction system. In particular, and as will be discussed in further detail below, the memory error correction system can determine a row address for a set of sub-word lines driving access to the plurality of bit rows. Based on the row address, the memory error correction system can generate a prefetch bit having a particular orientation and pattern of bits based on the determined row address. In particular, the memory error correction system may generate a prefetch bit in which bit values are grouped within specific error correction regions to enable fixing errors using a correction scheme associated with the ECC memory block or otherwise used by a memory controller on a central processing unit (CPU).

The present disclosure includes a number of practical applications having features described herein that provide benefits and/or solve problems associated with generating prefetch bit arrays that are compatible with error correction schemes utilized by an ECC memory block and a memory controller. In particular, the memory error correction system implements a number of features and functionality related to grouping bit values within respective error correction regions that enables identifying (e.g., calculating) and fixing bit errors within a pattern of bit values (e.g., a prefetch bit).

For example, by grouping bits in error correction regions, the memory error correction system is able to increase a percentage of bit errors originating from a memory module that are correctible using one or more error correction schemes. For example, where most memory bit errors may involve errors in values for single bits, some errors may be caused as a result of a faulty sub-word line driver or other hardware-related issue that causes entire bit rows to have erroneous values. Indeed, where a sub-word line driver goes down, any bit value affected by the sub-word line driver may be faulty, which significantly increases the likelihood of an uncorrectable error on a resulting pattern of bits. This type of error can cause an entire memory system to go down or result in significant interruption of a CPU. However, by grouping bit rows within error correction regions in accordance with one or more embodiments described herein, the memory error correction system enables a memory controller to correct errors from a broader class of read and write errors than conventional error correction systems.

In addition to increasing a percentage of bit errors to be correctible, the memory error correction system can enable performing error correction on memory blocks having wider I/O interfaces than what would normally be compatible with conventional error correction systems. For example, where many error correction systems utilize a correction scheme designed to detect errors on bit arrays having a width of four bits (e.g., a single nibble), implementation of the error correction regions in accordance with one or more embodiments described herein enables detecting and fixing bit errors on a prefetch bit generated using a wider I/O interface (e.g., 8 bits or multiple nibbles wide interface). For example, in one or more embodiments described herein, the memory error correction system implements error correction on an eight-bit wide pattern of bits (e.g., an 8×8 prefetch bit array) where a correction scheme of the ECC block is limited to calculating bit errors on a four-bit wide pattern of bits.

In addition, by implementing error correction regions and allowing error correction to be implemented on 8×8 prefetch bit arrays, the memory error correction system includes features and functionality that enable a memory module to implement error correction on memory modules without incurring a die size penalty. For example, by grouping bit rows within error correction regions in accordance with one or more embodiments described herein, the memory error correction system can avoid adding additional ECC memory blocks in an effort to compensate for wider prefetch bit arrays or as part of an implementation of a more robust or complex error correction scheme. Further, by strategically grouping bit rows in accordance with features described herein, the memory error correction system can avoid adding additional sub-word line drivers within respective memory blocks (incurring a die size penalty) in an effort to force isolation of bit rows within a prefetch bit independent of which sub-word line drivers are accessing bits from a memory block.

As illustrated in the foregoing discussion, the present disclosure utilizes a variety of terms to described various features and advantages of the systems described herein. Additional detail is now provided regarding the meaning of some of these terms.

For example, as used herein, a "computing device" may refer to any computing device capable of housing and implementing a processing unit (e.g., a CPU) having a memory controller implemented thereon and configured to correct errors from data read from a memory module (e.g. a DIMM). A computing device may refer to a mobile or non-mobile computing device (e.g., a laptop, desktop, smartphone, tablet). In one or more implementations, a computing device refers to one or more server devices on a network of connected computing devices (e.g., a cloud computing system).

As used herein, a "memory system" may refer to a system within a computing device including volatile or non-persistent memory resources and any components for managing or processing data maintained using the memory resources. For instance, a memory system may include memory modules including any number of DRAM memory blocks and one or more ECC memory blocks and any components implemented thereon (e.g., sub-word line drivers, I/O ports, etc.) The memory system may further include a processing unit (e.g., a CPU) having a memory controller thereon configured to manage a flow of data to and from memory components on the memory system. While one or more embodiments described herein specifically refer to a memory system including a DIMM that houses DRAM memory cells, other types of memory modules housing various types of memory may be implemented within a memory system.

In one or more embodiments described herein, a memory module includes sub-word line drivers implemented within memory blocks of the memory module. In one or more examples described herein, a "sub-word line driver" may refer to a local driver of a DRAM block capable of reading, writing, or otherwise accessing bits on storage nodes (e.g., capacitors) of the DRAM block. In one or more embodiments described herein, sub-word line drivers may have row addresses (e.g., even and odd row addresses) corresponding to locations of the sub-word line drivers within the memory block(s). Further, sub-word line drivers may be positioned between pairs of storage nodes such that the sub-word line driver is associated with accessing values from each storage node of the respective pair of storage nodes. Additional detail in connection with sub-word line drivers and associated storage nodes is discussed below in connection with example implementations illustrated in FIGS. 3A-3B.

As used herein, a "prefetch bit" refers to a pattern or array of bit values accessed from a memory block. For example, in one or more embodiments described herein, a "prefetch bit" refers to an 8×8 bit array of values extracted from storage nodes of a DRAM memory block over an eight-clock edge cycle. In particular, and as will be discussed in further detail below, a prefetch bit may refer to eight-bit rows extracted from eight I/O pins of an 8-bit interface and grouped in accordance with a correction scheme of an ECC memory block.

Figure 1:
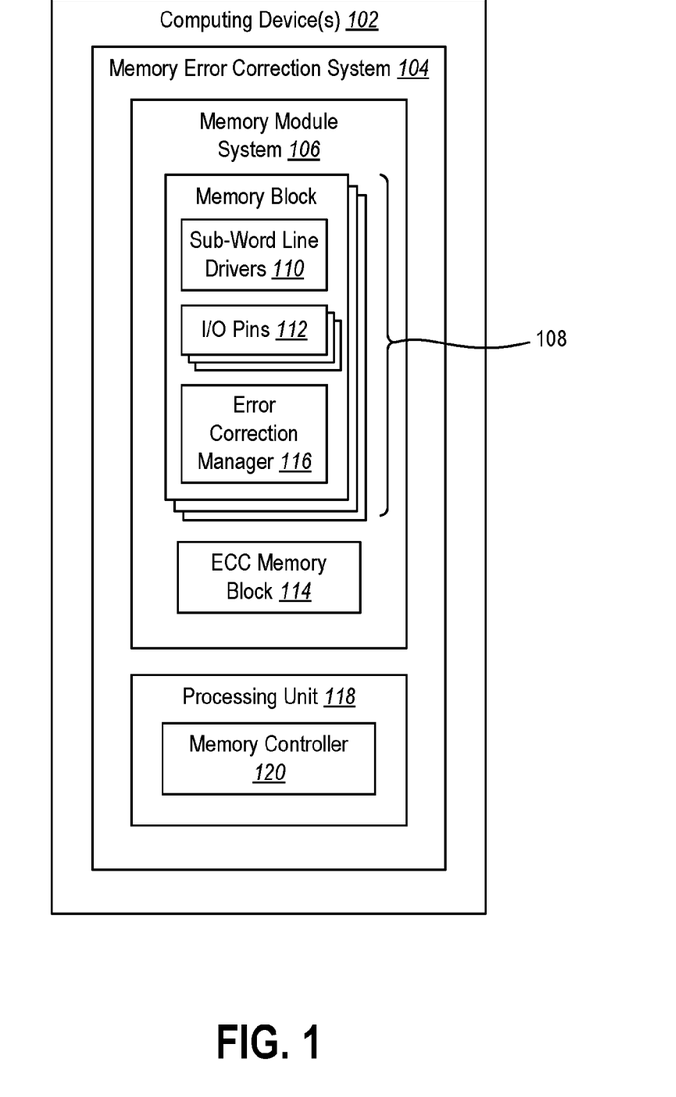
FIG. 1 illustrates an example computing device including a memory error correction system in accordance with one or more embodiments.

Additional detail will now be provided regarding the memory error correction system on a computing device in relation to illustrative figures portraying example implementations. For example, FIG. 1 illustrates an example computing device(s) 102 including a memory error correction system 104 implemented thereon. As shown in FIG. 1, the memory error correction system 104 includes a memory module system 106. In one or more embodiments described herein, the memory module system 106. As further shown, the memory module system 106 includes a plurality of memory blocks 108 having sub-word line drivers 110 and I/O pins 112 implemented thereon. The memory blocks 108 may additionally include an error correction manager 116. As further shown, the memory module system 106 may include one or more ECC memory blocks 114.

As just mentioned, and as shown in FIG. 1, the memory blocks 108 may include an error correction manager 116. The error correction manager 116 may include circuitry on the memory block (or on the periphery of the memory block) configured to generate a prefetch bit in which bit rows accessed from one or more memory blocks are grouped within respective memory correction regions. The error correction manager 116 may include circuitry for each memory block of the plurality of memory blocks 106 capable of selectively grouping bits (e.g., bit rows) within respective memory correction regions of a pattern (e.g., an 8×8 pattern) of bits. In one or more embodiments, the error correction manager 116 employs one or multiple multiplexers and demultiplexers and other digital logic circuitry that group digital data based on one or more characteristics (e.g., row addresses or groupings of storage nodes) of sub-word line drivers accessing a given plurality of bit rows. Additional detail in connection with the error correction manager 116 will be discussed below in connection with example implementations of the memory module system 106 and memory blocks 108.

In one or more embodiments, the memory module system 106 specifically refers to a dual inline memory module (DIMM) including a plurality of DRAM blocks implemented thereon. For instance, the memory module system 106 may include a DIMM having any number of DRAM blocks and one or multiple ECC memory blocks, which may similarly refer to a DRAM block purposed for implementing features of correcting bit errors from data accessed. In one or more examples described herein, the memory module system includes a DIMM having nine memory blocks including eight DRAM blocks and an associated ECC memory block. The memory module system may include multiple DIMMs. In addition, one or more memory modules may include eighteen memory blocks (e.g., sixteen DRAM blocks and two associated ECC memory blocks) or some other number of memory blocks based on a particular correction scheme employed by the memory error correction system 104.

As further shown in FIG. 1, the memory error correction system 104 can include a processing unit 118 including one or more components in communication with the memory module system 106. For example, in one or more embodiments described herein, the processing unit 118 includes a CPU having a memory controller 120 thereon capable of managing a flow of data in and out of the memory module system 106. In one or more embodiments, the memory control 120 manages communication between the memory module system 106 and any other components of the processing unit 118 and/or computing device(s) 102 generally.

Further, in one or more embodiments described herein, the memory controller 120 includes error detection and correction hardware capable of detecting and/or correcting bit errors on data accessed on the memory blocks 108. For example, in one or more embodiments, the memory controller 120 applies an error correction scheme (e.g., predefined error correction calculations or error calculation model) to prefetch bits accessed from the memory blocks 108 and an error correction bit row(s) generated in connection with the prefetch bits to determine and/or fix correctible bit errors identified within prefetch bits.

It will be understood that the computing device(s) 102 may refer to various types of computing devices. For example, a computing device may refer to a client device, such as a mobile device (e.g., a smart phone, a tablet, a laptop, a wearable computing device) or a non-mobile device (e.g., a desktop computer, a server device, a networked device on a cloud computing system) or other type of computing devices (e.g., edge computing device, information of things (IoT) device) or any device that utilizes memory thereon and is capable of implementing error correction capabilities.

Figure 2:
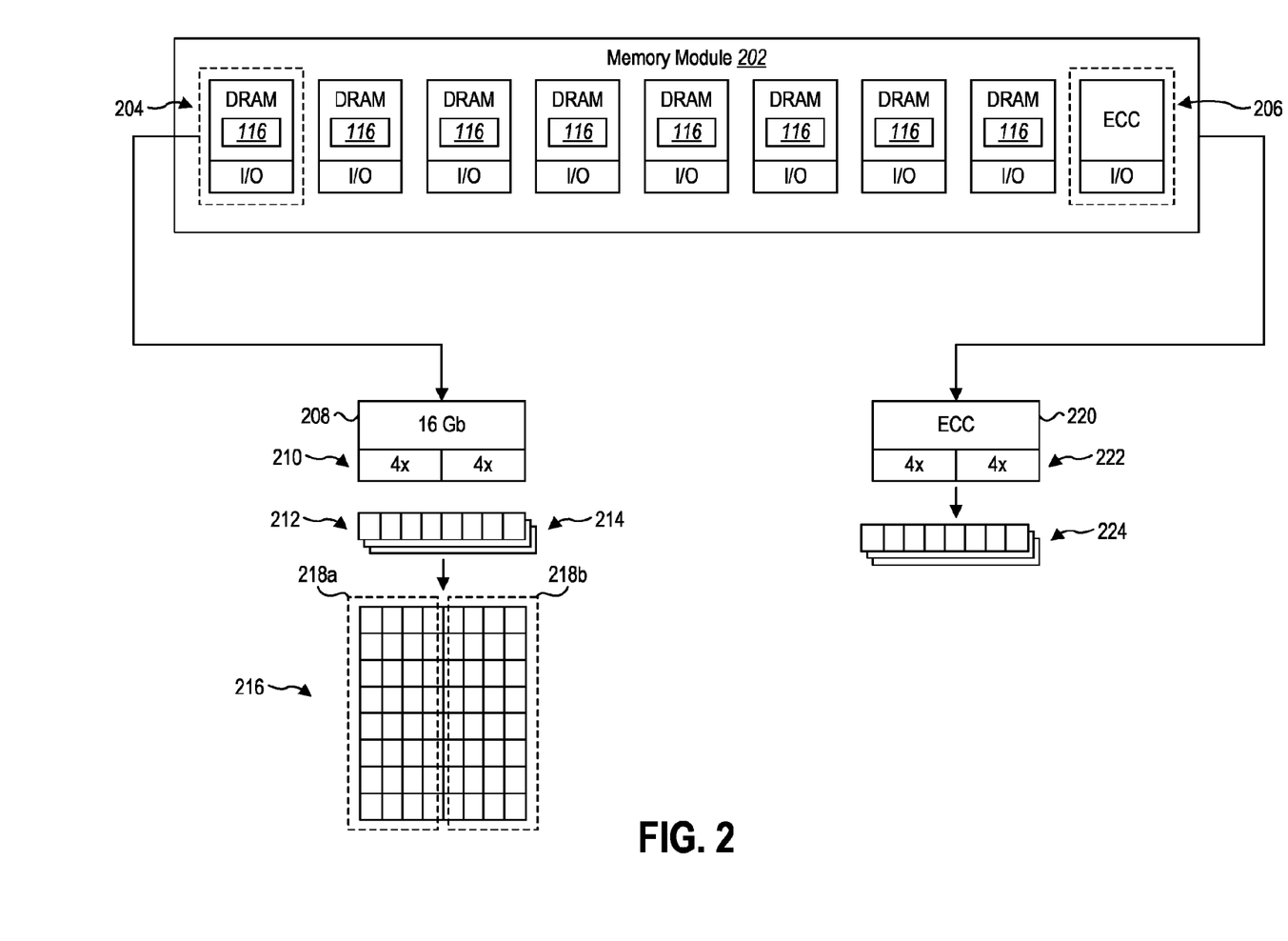
FIG. 2 illustrates an example memory module for implementing the memory error correction system in accordance with one or more embodiments.

Additional information is provided in connection with an example memory module shown in FIG. 2. For example, FIG. 2 illustrates an example memory module 202 including a plurality of DRAM blocks and an ECC memory block. In particular, as shown in FIG. 2, the memory module 202 may include eight DRAM blocks and an ECC block. Each of the memory blocks may include I/O interfaces for communicating data to other components of a memory system and a memory controller 120 (not shown). As shown in FIG. 2, and as will be discussed in further detail below, each of the memory blocks may include an error correction manager 116 implemented thereon.

For illustrative purposes, FIG. 2 shows an example memory block 208 including a sixteen gigabyte (Gb) block of memory. As shown in FIG. 2, the memory block 208 includes an 8-bit wide I/O interface 210 including a first four data in data out (DQ) pins (e.g., DQ pins 0, 1, 2, and 3) corresponding to a lower nibble of data and a second four DQ pins (e.g., DQ pins 4, 5, 6, and 7) corresponding to an upper nibble of data. Thus, each bit row input or output from the I/O interface 210 includes a lower nibble 212 and an upper nibble 214 including values read from the memory block 208.

In one or more embodiments, sub-word line drivers implemented within the memory block 208 access, read, or otherwise generate a bit row for a single clock cycle. In addition, and as shown in FIG. 2, a single access of the memory block 208 can involve a burst read of eight bit rows over eight clock cycles (e.g., of the processing unit 118) to generate a prefetch bit 216 including an 8×8 pattern of bit rows. In particular, and as will be discussed below in further detail in connection with FIGS. 3A-3B, the memory module may utilize one or more error correction managers 116 to group bit rows within respective error correction regions 216a-b.

As further shown in FIG. 2, the memory module 202 may include an ECC component 206. The ECC component 206 may include an ECC block 220 having an 8-bit wide I/O interface 222. In one or more embodiments, the ECC block 220 generates an 8-bit ECC bit row 224 including data that enables the memory controller 120 to detect bit errors and fix one or more bit values within a corresponding prefetch bit 216. In one or more embodiments, sub-word line drivers on the ECC block 220 generate an ECC bit row 224 for each of a plurality of prefetch bits generated by the memory blocks of the memory module 202. While FIG. 2 shows an example including a single ECC component 206, one or more implementations of the memory module 202 may include multiple (e.g., two) ECC components corresponding to the eight (or more) DRAM blocks.

As mentioned above, in one or more implementations, the bit rows accessed from the ECC block 220 may be used by the memory controller to identify and fix various bit errors discovered within the prefetch bit 216. Nevertheless, in one or more embodiments, the correction scheme utilized by the memory controller 120 and the ECC block 220 may limit performing error correction to errors detected within a single error correction region within the prefetch bit. Thus, while the memory controller 210 may be capable of identifying and correcting single bit errors on 8×8 prefetch bits generated in accordance with any number of serializing methods, any prefetch bit in which multiple errors exist across error correction regions may result in uncorrectable errors. These uncorrectable errors may cause the memory system to crash and/or causing significant interruptions in operation of a computing device.

In one or more embodiments, the ECC block 220 may be used to identify and fix one or multiple bit errors where the bit error(s) are isolated within a single error correction region. In contrast, the prefetch bit 216 may be uncorrectable using the ECC block 220 where the prefetch bit 216 includes one or more bit errors within the first error correction region 218a and the second error correction region 218b. Indeed, even where an entire column of the prefetch bit 216 includes faulty bit values, the ECC block may be used to fix the bit errors so long as the column of erroneous bits are grouped within a single error correction region.

As shown in FIG. 2, the prefetch bit 216 may include bit rows that are grouped within respective error correction regions 218a-b by the error correction manager 116. In particular, as shown in FIG. 2, the prefetch bit 216 includes a first error correction region 218a referring to a first four columns of the prefetch bit 216 (e.g., lower nibbles of respective bit rows of the prefetch bit 216). The prefetch bit 216 further includes a second error correction region 218b referring to a second four columns of the prefetch bit 216 (e.g., upper nibbles of respective bit rows of the prefetch bit 216).

Figure 3A:
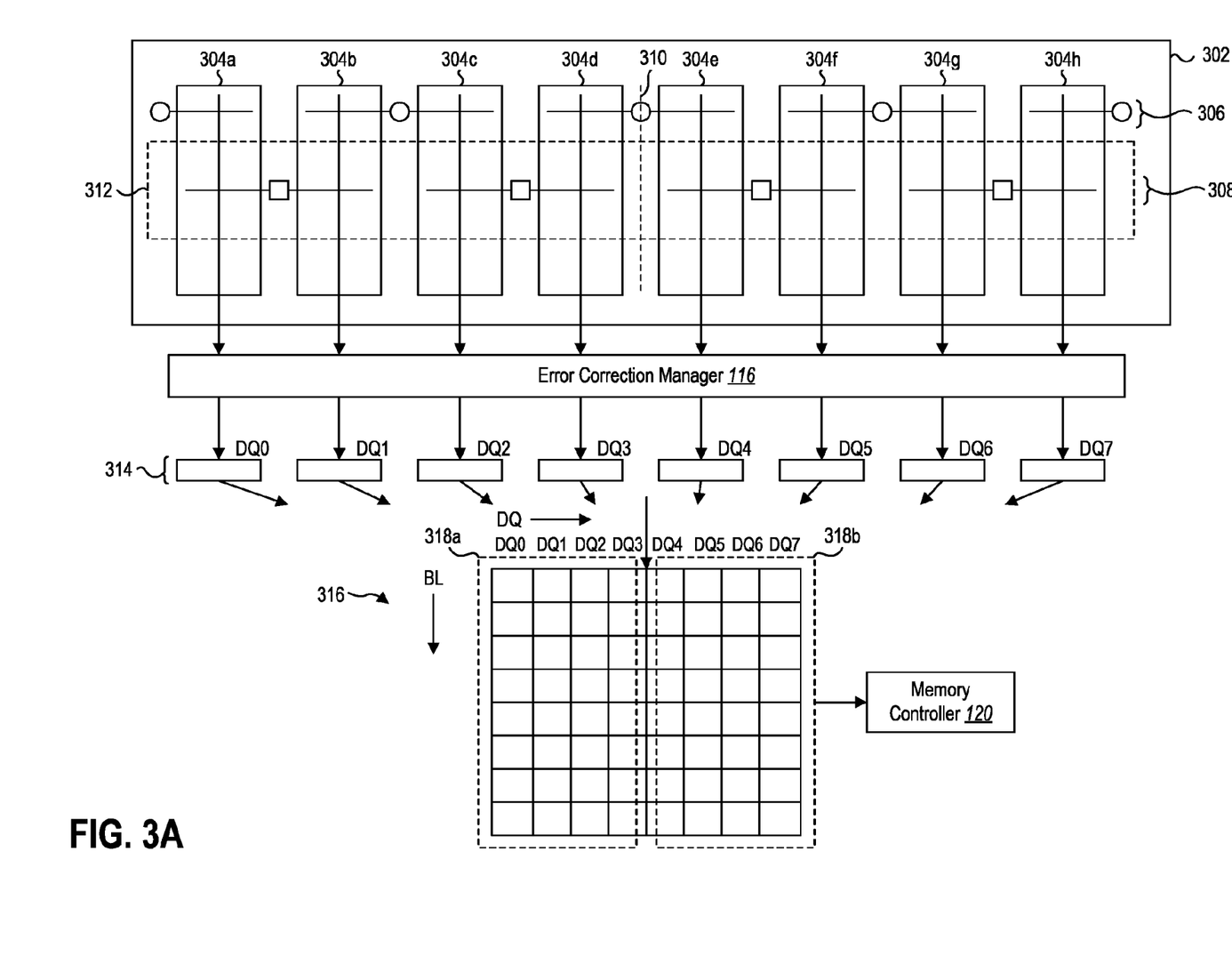
FIG. 3A illustrates an example implementation of generating a bit array compatible with an error correction system in accordance with one or more embodiments.

Additional information will now be discussed in connection with grouping the bit rows read from a memory block into respective error correction regions of a prefetch bit in accordance with one or more embodiments. As a first example, FIG. 3A illustrates an implementation of a memory block 302 (e.g., a DRAM block). As shown in FIG. 3A, the memory block 302 includes a plurality of storage nodes 304a-h including transistors, capacitors, and other circuitry for storing or otherwise maintaining bit values on the memory block 302. In one or more embodiments, the memory block 302 refers to a 16 Gb memory block having an eight-bit wide I/O interface housed within a memory module (e.g., a DIMM). The I/O interface may include local I/Os having multiplexers and other circuitry for selectively accessing bits from indicated addresses (e.g., row addresses) of the storage nodes 304a-h. For example, in one or more embodiments, the I/O interface includes an interface of multiplexers that feed I/Os from the storage nodes 304a-h into an error correction manager 116.

As shown in FIG. 3A, the memory block 302 includes a number of sub-word line drivers implemented thereon. Each of the sub-word line drivers may be positioned within the memory block 302 at corresponding row addresses. For instance, in the example shown in FIG. 3A, the memory block includes a first set of sub-word line drivers 306 (denoted with circles) at an odd row address within the memory block 302. As further shown, the memory block 302 may include a second set of sub-word line drivers 308 (denoted with squares) at an even row address within the memory block 302.

Each of the sets of sub-word line drivers 306-308 may be positioned relative to the storage nodes 304a-h based on row addresses of the corresponding sets of sub-word line drivers. For example, the first set of sub-word line drivers 306 may include a first sub-word line driver associated with a first storage node 304a, a second sub-word line driver associated with both a second storage node 304b and a third storage node 304c, a third word line driver associated with both a fourth storage node 304d and a fifth storage node 304e, a fourth sub-word line driver associated with both a sixth storage node 304f and a seventh storage node 304g, and a fifth sub-word line driver associated with an eighth storage node 304h. Each of the sub-word line drivers from the first set of sub-word line drivers 306 may be referred to herein as odd sub-word line drivers or a set of odd sub-word line drivers.

Along similar lines, the second set of sub-word line drivers 308 may include a first sub-word line driver associated with the first storage node 304a and the second storage node 304b, a second sub-word line driver associated with a third storage node 304c and a fourth storage node 304d, a third sub-word line driver associated with a fifth storage node 304e and a sixth storage node 304f, and a fourth sub-word line driver associated with a seventh storage node 304g and an eighth storage node 304h. Each of the sub-word line drivers from the second set of sub-word line drivers 308 may be referred to herein as even sub-word line drivers or a set of even sub-word line drivers.

As used herein, a sub-word line driver associated with a corresponding storage node refers to a sub-word line driver capable of accessing and reading data from a corresponding storage node. For instance, as shown in FIG. 3A, each of the sub-word line drivers include horizontal row lines extending from the sub-word line drivers to indicate storage nodes from which the sub-word line driver can access data and drive access of bit rows.

As shown in FIG. 3A, the first four storage nodes 304a-d may be separated from the second four storage nodes 304e-h by a fault line 310. In this example, the fault line 310 indicates groupings of the storage nodes 304a-h based on reading a plurality of I/Os accessed from the respective storage nodes 304a-h and using a bit line (BL) mapping orientation. Further detail in connection with grouping bit rows using the BL mapping orientation is discussed below.

The sub-word line drivers may be used to access bits from the storage nodes 304a-h. In the illustrated example, the second set of sub-word line drivers may access and generate I/Os from each of the respective storage nodes 304a-h. In particular, where the second set of sub-word line drivers 308 refers to an active set of sub-word line drivers 312, the even sub-word line drivers can generate a burst of I/Os including bit rows 314 that are eight bits wide (e.g., based on a number of clock cycles for a given access).

Each of the I/O lines may be provided to an error correction manager 116. As mentioned above, the error correction manager 116 may include circuitry for serializing bit rows 314 and generating a prefetch bit 316 including a compilation of the bit rows 314. In the example shown in FIG. 3A, the error correction manager 116 can serialize the bit rows 314 and generate a prefetch bit 316 including an 8×8 array of bit values from the bit rows 314 accessed or otherwise generated by the even sub-word line drivers.

For example, as shown in FIG. 3A, the error correction manager 116 can route or otherwise steer the bit rows 314 in a way that strategically groups the bit rows 314 within error correction regions 318a-b to increase a likelihood that the prefetch bit 316 is correctable using the ECC memory block(s) of the memory module. In particular, the error correction manager 116 can serialize the bit rows 314 using multiplexers and other logic circuitry to ensure that bit rows are aligned, grouped, or otherwise oriented within the prefetch bit 316 to ensure that bit rows read by specific sub-word line drivers do not span across the error correction regions 318a-b of the prefetch bit 316.

As an example, in one or more embodiments, the error correction manager 116 includes a set of multiplexers that receive I/O values from the I/O interfaces reading bits from the storage nodes 304a-h. The multiplexers of the error correction manager 116 may receive as input a row address corresponding to an active set of sub-word line drivers 312 reading or otherwise accessing the storage nodes 304a-h. Based on the row address, the multiplexers can steer the values into the bit rows 314 in a specific orientation (e.g., a BL orientation) and in a specific order to ensure that the resulting prefetch bit 316 includes bit values grouped in ECC-compatible correction regions 318a-b, as shown in FIG. 3A.

In the example shown in FIG. 3A, the error correction manager 116 may group the bit rows 314 based on a determination that the active set of sub-word line drivers 312 (e.g., the set of sub-word line drivers used to access the bit rows 314) is an even row of sub-word line drivers. The error correction manager 116 may determine the address (e.g., a specific address or simply an even or odd status of the address) in a variety of ways. For instance, the error correction manager may identify a least significant bit (LSB) for the row of bits. In particular, the LSB may refer to a row address provided to the error correction manager 116 for use in serializing the data rows 314 in a particular way (e.g., based on the LSB being an even row address) that maximizes efficacy of an error correction scheme utilized by the ECC block and/or the memory controller 120.

In one or more embodiments, determining that the active set of sub-word line drivers 312 is an even row provides an indication to the error correction manager 116 of which storage nodes 304a-h are grouped with common sub-word line drivers. In particular, in this example, the error correction manager 116 may determine, based on determining that the second set of sub-word line drivers 308 is the active set 312 (e.g., based on an identified LSB for a row of bits), that a first and second bit row from the set of bit rows 314 were accessed using the same sub-word line driver, that a third and fourth bit row from the set of bit rows 314 were accessed using the same sub-word line driver, that a fifth and sixth bit row from the set of bit rows 314 were accessed using the same sub-word line driver, and that a seventh and eighth bit rows from the set of bit rows 314 were accessed using the same sub-word line driver.

More specifically, based on a determination of the specific groupings of bit rows with corresponding sub-word line drivers, the error correction manager 116 may determine whether word lines extending from any of the sub-word line drivers from the active set of sub-word line drivers 312 crosses a fault line 310 on the memory block 302. The error correction manager 116 may utilize this determination when serializing the bit rows to generate the pattern of bits that form the prefetch bit 316.

In this example, because none of the even sub-word line drivers have associated word lines that cross the fault line 310 (e.g., the default or natural fault line of the memory block 302), the error correction manager 116 may serialize or otherwise combine the bit rows using a burst length (BL) orientation. In particular, as shown in FIG. 3A, the error correction manager 116 may multiplex the bit rows 314 such that each of the bit rows 314 are oriented vertically relative to a boundary between the first error correction region 318a and the second error correction region 318b. As used herein, this orientation of bit rows 314 oriented vertically refers to a bit line (BL) orientation or a BL architecture of the prefetch bit 316.

As illustrated in the example configuration shown in FIG. 3A, the prefetch bit 316 includes the bit rows 314 mapped in accordance with a BL orientation and grouped within respective error correction regions 318a-b. In particular, as shown in FIG. 3A, the prefetch bit 316 includes a first bit row (DQ0) mapped to a first column, a second bit row (DQ1) mapped to a second column, a third bit row (DQ2) mapped to a third column, and a fourth bit row (DQ3) mapped to a fourth column each grouped within a first correction region 318a. As further shown, the prefetch bit 316 includes a fifth bit row (DQ4) mapped to a fifth column, a sixth bit row (DQ5) mapped to a sixth column, a seventh bit row (DQ6) mapped to a seventh column, and an eight bit row (DQ7) mapped to an eighth column each grouped within a second correction region 318b.

As mentioned above, FIG. 3A illustrates an example in which the error correction manager 116 maps the bit rows using a BL orientation based on a determination that a LSB of the active set of sub-word line drivers is an even row address and that the even sub-word line drivers are naturally grouped in a way that none of the sub-word lines intersect the fault line 310. Accordingly, by mapping the bit rows 314 as shown in FIG. 3A, the error correction manager 116 significantly increases the likelihood that the prefetch bit is either correct or has a correctible bit error that does not extend between both correction regions 318a-b. Indeed, this benefit holds true even where an entire bit row is corrupted or where a specific sub-word line driver from the second set of sub-word line drivers 308 goes down altogether.

As shown in FIG. 3A, the prefetch bit 316 may be provided to a memory controller 120 for further processing. In one or more implementations, the memory controller 120 receives the prefetch bit 316 in addition to one or more bit rows or prefetch bits from the ECC memory block. The memory controller 120 may utilize the data from the ECC block to implement a correction scheme to identify and/or fix any correctible errors found within the prefetch bit.

Figure 3B:
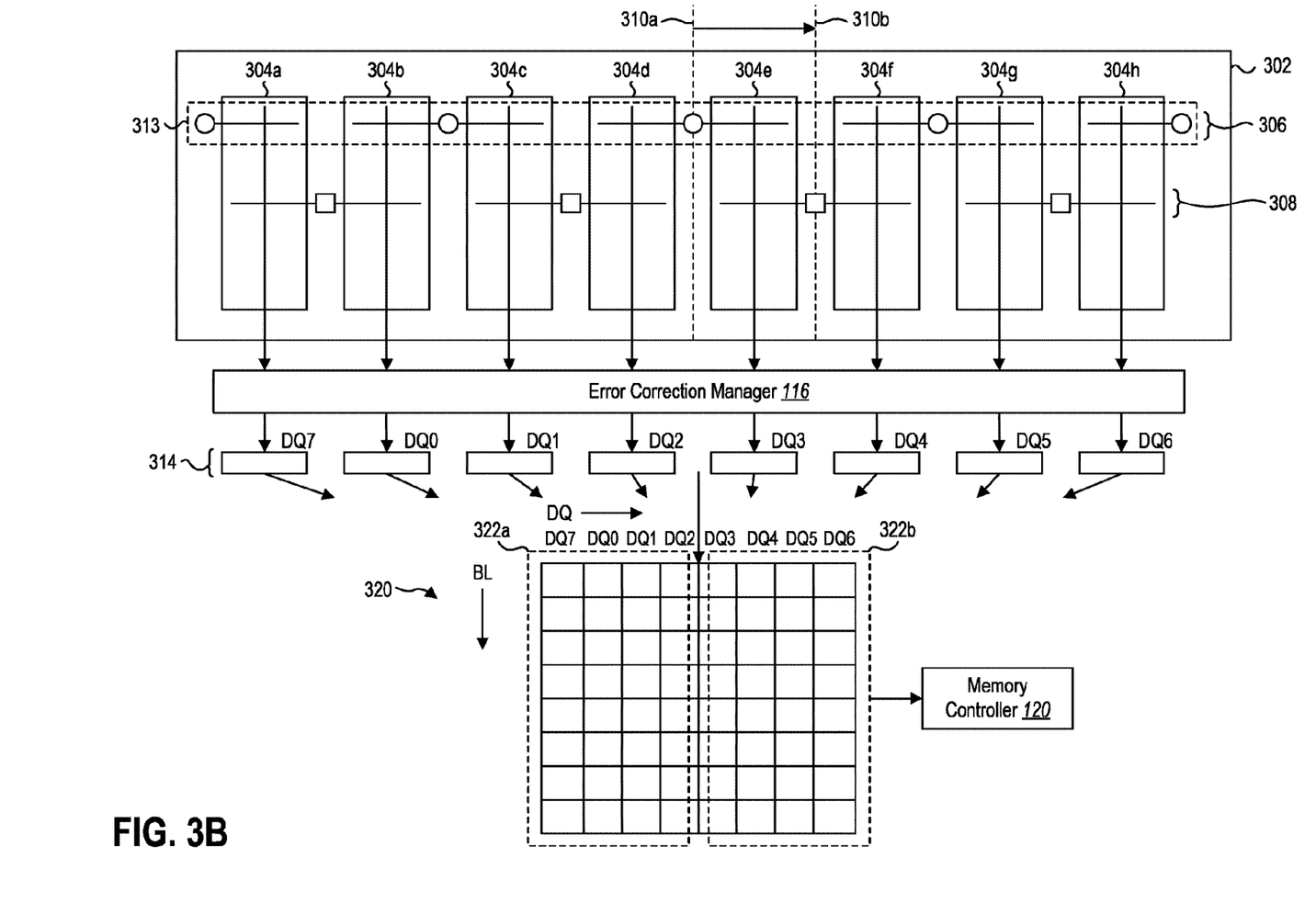
FIG. 3B illustrates another example implementation of generating a bit array compatible with an error correction system in accordance with one or more embodiments.

FIG. 3B illustrates another example implementation a memory error correction system 104 in accordance with one or more embodiments. For example, FIG. 3B illustrates an example implementation of a memory block 302 within a memory module (e.g., a DIMM) on the memory error correction system 104. In particular, similar to the memory block 302 discussed above in connection with FIG. 3A, the memory block 302 includes storage nodes 304a-h and sets of sub-word line drivers 306-308 capable of accessing bit rows from the storage nodes.

In contrast to FIG. 3A, the example shown in FIG. 3B shows that the first set of sub-word line drivers 306 (e.g., the odd sub-word line drivers) refers to an active set 313 in which the odd sub-word line drivers are accessing and generating a set of bit rows from the storage nodes 304a-h for use in generating a prefetch bit. In particular, as shown in FIG. 3B, the odd set of sub-word line drivers 306 accesses a plurality of bit rows 315 including a first bit row (DQ0), a second bit row (DQ1), a third bit row (DQ2), a fourth bit row (DQ3), a fifth bit row (DQ4), a sixth bit row (DQ5), a seventh bit row (DQ6) and an eighth bit row (DQ7) each corresponding to respective storage nodes 304a-h and associated with the odd set of sub-word line drivers.

As shown in FIG. 3B (and as discussed above), the odd set of sub-word line drivers 306 can be associated with one or more storage nodes. In contrast to the even set of sub-word line drivers 308, the odd set of sub-word line drivers 306 includes a middle sub-word line driver including sub-word lines that extend across a fault line 310a (e.g., a default or natural fault line of the memory block 302) that divides the first four storage nodes 304a-d from a next four storage nodes 304e-h.

As a result of a sub-word line drivers from the odd set of sub-word line drivers 306 having sub-word lines that cross the fault line 310a, mapping the plurality of bit rows 315 to a prefetch bit using an identical orientation as the example discussed above in connection with FIG. 3A would result in one or more bit rows driven by or otherwise accessed using the same sub-word line driver being oriented within the prefetch bit within different error correction regions. As a result, if the error correction manager 116 were to map the bit rows 315 in the same way as shown in FIG. 3A, there would be an increased possibility of uncorrectable errors within the resulting prefetch bit. In particular, where the middle sub-word line driver were to go down resulting in likely errors within the fourth bit row (DQ3) and/or the fifth bit row (DQ4), the resulting prefetch bit would likely include uncorrectable errors and cause one or more systems to crash or fail.

Instead of mapping the bit rows 315 using the same BL orientation of FIG. 3A, the error correction manager 116 may generate a prefetch bit 320 using a different mapping based on a determination that the odd set of sub-word line drivers 306 is the active set 313 driving the access of the bit values. For example, based on determining the row address of the active set of sub-word line drivers 306 (e.g., based on a row address of an LSB for the row of bits), the error correction manager 116 can shift placement of one or more of the bit rows 315 within the resulting prefetch bit 320.

In particular, the error correction manager 116 may multiplex or otherwise map the bit rows 315 in such a way that effectively moves or shifts an initial position of the fault line 310a to a modified fault line 310b. For example, the error correction manager 116 may shift the I/O values into bit rows 315 as shown in FIG. 3B to ensure that pairs of storage nodes associated with each of the sub-word line drivers from the odd set of sub-word line drivers 306 are grouped within first and second correction regions 322a-b of the prefetch bit such that no two bit rows associated with a corresponding sub-word line driver intersects the modified fault line 310b.

For example, the error correction manager 116 can modify the mapping using the BL orientation discussed above in connection with FIG. 3A. More specifically, the error correction manager 116 can similarly use a BL mapping orientation in which the bit rows 315 are oriented vertically relative to a boundary between the first correction region 322a and the second correction region 322b. In addition, the error correction manager 116 may multiplex the bit rows 315 in such a way as to group pairs of bit rows associated with a common sub-word line driver within the respective error correction regions 322a-b.

For instance, as shown in FIG. 3B, the error correction manager 116 can generate a prefetch bit 320 including a first correction region 322a having the eighth bit row (DQ7), the first bit row (DQ0), the second bit row (DQ1), and the third bit row (DQ2) associated with bits from corresponding storage nodes 304h, 304a-c. Further, the resulting prefetch bit 320 may include a second correction region 322b having the fourth bit row (DQ3), the fifth bit row (DQ4), the sixth bit row (DQ5), and the seventh bit row (DQ6) associated with bits from corresponding storage nodes 304c-g. As mentioned above, none of the resulting groupings of bit rows include bit rows from a sub-word line driver associated with bit lines that intersect the modified fault line 310b. As a result, the error correction manager 116 increases a likelihood that error correction may successfully fix any identified bit errors within the prefetch bit 320.

While FIG. 3B shows an example grouping of the bit rows 315 within respective error correction regions 322a-b in accordance with one embodiment, the error correction manager 116 can group the bit rows 315 within the error correction regions 322a-b in a variety of ways. For example, the error correction manager 116 can shift or otherwise group the bit rows using a BL orientation in any order or combination so long as bit rows originating from corresponding word lines and storage nodes associated with a specific sub-word line driver are not distributed across multiple error correction regions 322a-b.

As further shown, the prefetch bit 320 may be provided to the memory controller 120 for further processing. Similar to the example discussed above in connection with FIG. 3A, the memory controller 120 can receive the prefetch bit 320 in conjunction with bits from the ECC memory block. The memory controller 120 may utilize the received data to implement a correction scheme to identify and/or fix any correctible errors found within the prefetch bit 320.

In addition, while FIGS. 3A-3B illustrate specific examples in which bit lines are read or otherwise accessed from nodes of a memory block and multiplexed, steered, or otherwise grouped within respective memory correction regions, similar features and functionality may apply when writing data to the memory block 302. For example, in one or more embodiments, the error correction manager 116 may include de-multiplexers and other circuitry for steering bit lines to respective storage nodes of the memory block based on identified row addresses of sub-word line drivers writing the data to the storage nodes of the memory block 302. Similar to reading the data to the prefetch bit, similarly steering bit values when writing to the memory block further decreases the occurrence of uncorrectable errors.

Figure 4:
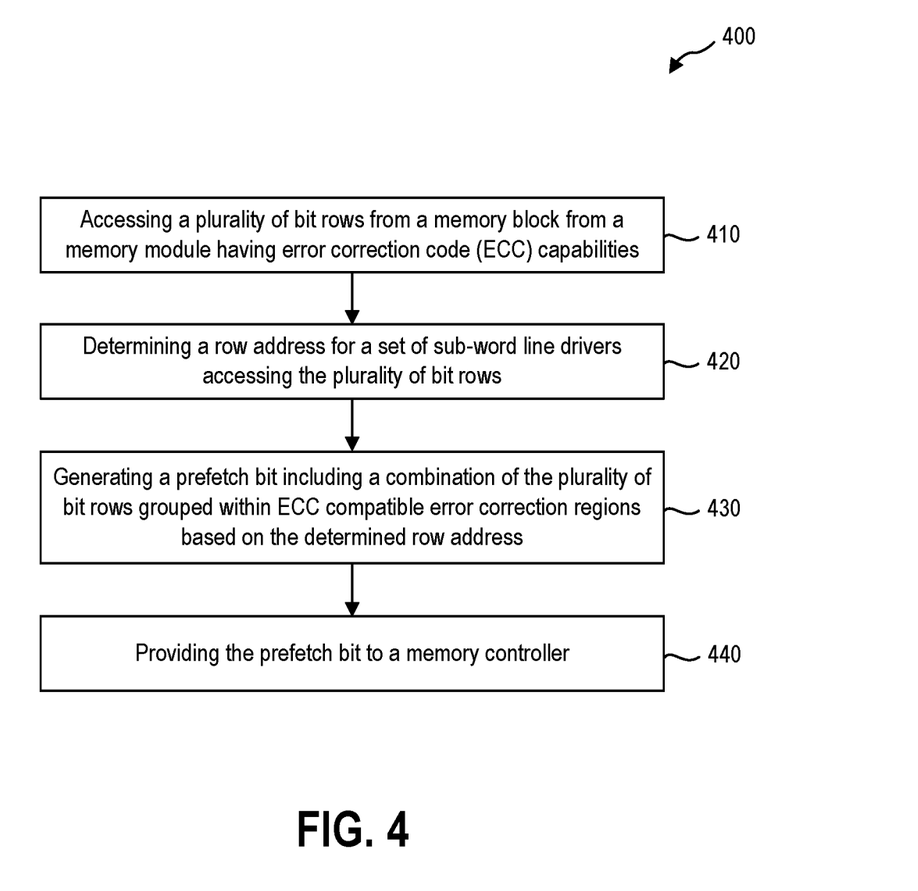
FIG. 4 illustrates an example series of acts for implementing the memory correction system in accordance with one or more embodiments.

Turning now to FIG. 4, this figure illustrates example flowcharts including a series of acts for accessing bit rows and generating an array of bits that decreases a likelihood of uncorrectable errors within data accessed on a memory system. While FIG. 4 illustrates acts according to one or more embodiments, alternative embodiments may omit, add to, reorder, and/or modify any of the acts shown in FIG. 4. The acts of FIG. 4 can be performed as part of a method. Alternatively, a non-transitory computer-readable medium can include instructions that, when executed by one or more processors, cause a computing device to perform the acts of FIG. 4. In still further embodiments, a system can perform the acts of FIG. 4.

FIG. 4 illustrates a series of acts 400 related to reading, writing, or otherwise accessing bit rows and generating an array of bits in accordance with one or more embodiments described herein. As shown in FIG. 4, the series of acts 400 includes an act 410 of accessing a plurality of bit rows from a memory block from a memory module having error correction code (ECC) capabilities. For example, in one or more embodiments, the act 410 involves accessing a plurality of bit rows from nodes of a memory block where the memory block includes a digital memory block from a memory module having a plurality of memory blocks and an error correction code (ECC) memory block configured to correct errors within the plurality of memory blocks of the memory module.

As further shown, the series of acts 400 includes an act 420 of determining a row address for a set of sub-word line drivers accessing the plurality of bit rows. For example, in one or more embodiments, the act 420 includes determining a row address for a set of sub-word line drivers accessing the plurality of bit rows.

As further shown, the series of acts 400 includes an act 430 of generating a prefetch bit including a combination of the plurality of bit rows grouped within ECC compatible error correction regions based on the determined row address. For example, in one or more embodiments, the act 430 involves generating a prefetch bit including a combination of the plurality of bit rows grouped within error correction regions of the prefetch bit based on the determined row address for the set of sub-word line drivers where groupings of the plurality of bits within the error correction regions are compatible with a correction scheme of the ECC memory block.

As further shown, the series of acts 400 includes an act 440 of providing the prefetch bit to a memory controller. For example, in one or more embodiments, the act 440 involves providing the prefetch bit to a memory controller on a central processing unit (CPU) coupled to the memory module.

In one or more embodiments, determining the row address includes identifying a least significant bit (LSB) for the set of sub-word line drivers. In one or more implementations, generating the prefetch bit includes grouping bits from the plurality of bit rows in an orientation within respective error correction regions based on the LSB for the set of sub-word line drivers. Further, in one or more embodiments, grouping the bits from the plurality of bit rows includes multiplexing values of the plurality of bit rows into a pattern of bits based on the row address for the LSB in accordance with the correction scheme of the ECC memory block.

In one or more embodiments, determining the row address includes determining that the set of sub-word line drivers is an even row in which no sub-word lines accessed by the sub-word line drivers intersect a fault line of input/output (I/O) pins of the memory block. In addition, in one or more implementations, generating the prefetch bit includes, based on determining that the set of sub-word line drivers is an even row, orienting a pattern of bits of the prefetch bit in a burst line orientation in which the plurality of bit rows are mapped parallel to a boundary between a first correction region and a second correction region.

In one or more embodiments, determining the row address includes determining that the set of sub-word line drivers is an odd row in which at least one sub-word line driver intersects a fault line of input/output (I/O) pins of the memory block. In addition, in one or more implementations, generating the prefetch bit includes based on determining that the set of sub-word line drivers is an odd row, orienting a pattern of bits of the prefetch bit in a burst line orientation in which the plurality of bit rows are mapped parallel to a boundary between a first correction region and a second correction region. Generating the prefetch bit may further include, based on determining that the set of sub-word line drivers is an odd row, remapping one or more bit rows from the second correction region to first correction region such that none of the bit rows associated with the at least one sub-word line driver are distributed across the first correction region and the second correction region.

In one or more embodiments, the memory module includes a dual in-line memory module (DIMM). The plurality of memory blocks may include a plurality of DRAM blocks. Further, the prefetch bit may include an 8×8 pattern of bits based on each DRAM block having eight I/O ports.

In addition, features and functionality of one or more embodiments described herein may be performed by a memory system. For example, in one or more embodiments, a memory system includes a plurality of memory blocks, the plurality of memory blocks including a first plurality of dynamic random-access memory (DRAM) memory blocks and an error correction code (ECC) memory block housed within a dual-in line memory module (DIMM). The memory system may further include a plurality of sub-word line drivers implemented within a first memory block of the plurality of memory blocks, the plurality of sub-word line drivers including a set of sub-word line drivers configured to read a plurality of bit rows from nodes of the first memory block. Further, the memory system may include an error correction manager including logic circuitry for generating a prefetch bit from the plurality of bit rows, wherein generating the prefetch bit comprises grouping the plurality of bit rows within error correction regions based on a determined row address for the set of sub-word line drivers and in accordance with a correction scheme employed by the ECC memory block. In one or more embodiments, the memory system includes an error correction manager implemented within or on a periphery of each of the memory blocks.

Further, in one or more embodiments, the set of sub-word line drivers includes an even row of sub-word line drivers positioned between nodes of the first memory block such that no sub-word lines accessed by each sub-word line driver of the set of sub-word line driver intersects a fault line of input/output (I/O) pins of the first memory block. In this example, generating the prefetch bit may include orienting a pattern of bits of the prefetch bit in a burst line orientation in which the plurality of bit rows are mapped parallel to a boundary between a first correction region and a second correction region.

In one or more embodiments, the set of sub-word line drivers includes an odd row of sub-word line drivers positioned between nodes of the first memory block such that one or more word lines accessed by each sub-word line driver of the set of sub-word line drivers intersects a fault line of input/output (I/O) pins of the first memory block. In this example, generating the prefetch bit may include orienting a pattern of bits of the prefetch bit in a burst line orientation in which the plurality of bit rows are mapped parallel to a boundary between a first correction region and a second correction region and remapping one or more of bit rows from the second correction region to the first correction region such that none of the bit rows associated with the at least one sub-word line driver are distributed across the first correction region and the second correction region.

In one or more embodiments, grouping the plurality of bit rows within error correction regions is based on a least significant bit (LSB) for the set of sub-word line drivers. Moreover, in one or more embodiments, the logic circuitry of the error correction manager includes one or more multiplexers for multiplexing values of the plurality of bit rows into a pattern of bits based on a row address for the set of sub-word line drivers in accordance with the correction scheme of the ECC memory block. In one or more embodiments, the logic circuitry additionally includes one or more de-multiplexers for de-multiplexing values (e.g., when writing data to the memory blocks).

Figure 5:
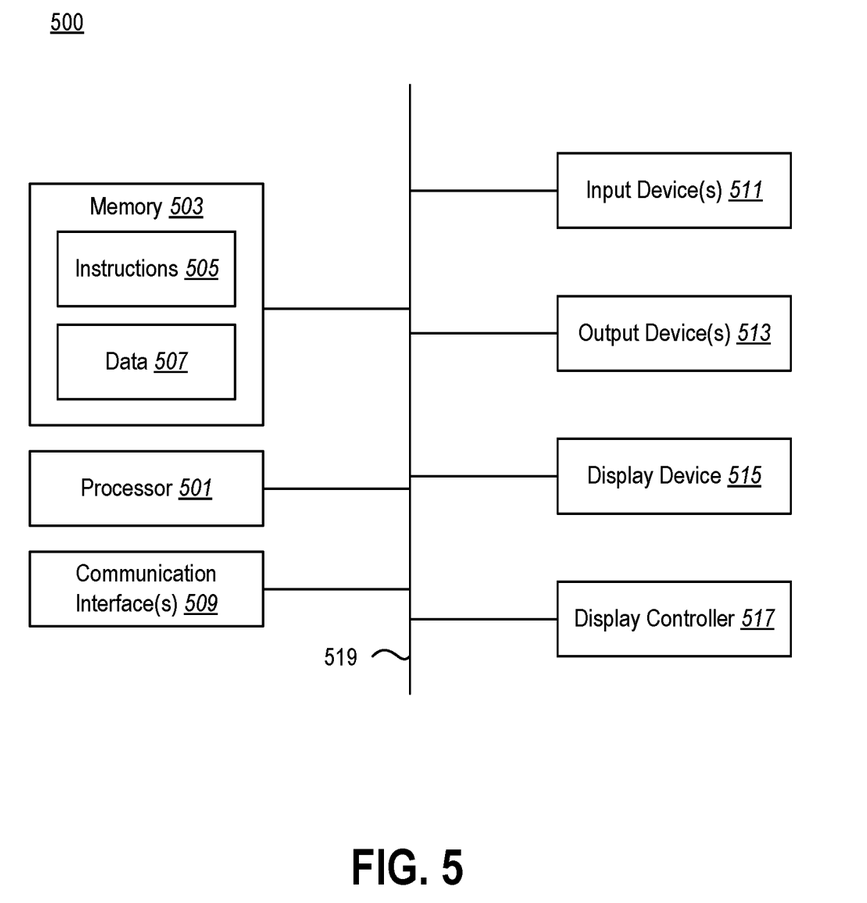
FIG. 5 illustrates certain components that may be included within a computer system.

FIG. 5 illustrates certain components that may be included within a computer system 500. One or more computer systems 500 may be used to implement the various devices, components, and systems described herein.

The computer system 500 includes a processor 501. The processor 501 may be a general-purpose single- or multi-chip microprocessor (e.g., an Advanced RISC (Reduced Instruction Set Computer) Machine (ARM)), a special purpose microprocessor (e.g., a digital signal processor (DSP)), a microcontroller, a programmable gate array, etc. The processor 501 may be referred to as a central processing unit (CPU). Although just a single processor 501 is shown in the computer system 500 of FIG. 5, in an alternative configuration, a combination of processors (e.g., an ARM and DSP) could be used.

The computer system 500 also includes memory 503 in electronic communication with the processor 501. The memory 503 may be any electronic component capable of storing electronic information. For example, the memory 503 may be embodied as random access memory (RAM), read-only memory (ROM), magnetic disk storage media, optical storage media, flash memory devices in RAM, on-board memory included with the processor, erasable programmable read-only memory (EPROM), electrically erasable programmable read-only memory (EEPROM) memory, registers, and so forth, including combinations thereof.

Instructions 505 and data 507 may be stored in the memory 503. The instructions 505 may be executable by the processor 501 to implement some or all of the functionality disclosed herein. Executing the instructions 505 may involve the use of the data 507 that is stored in the memory 503. Any of the various examples of modules and components described herein may be implemented, partially or wholly, as instructions 505 stored in memory 503 and executed by the processor 501. Any of the various examples of data described herein may be among the data 507 that is stored in memory 503 and used during execution of the instructions 505 by the processor 501.

A computer system 500 may also include one or more communication interfaces 509 for communicating with other electronic devices. The communication interface(s) 509 may be based on wired communication technology, wireless communication technology, or both. Some examples of communication interfaces 509 include a Universal Serial Bus (USB), an Ethernet adapter, a wireless adapter that operates in accordance with an Institute of Electrical and Electronics Engineers (IEEE) 802.11 wireless communication protocol, a Bluetooth® wireless communication adapter, and an infrared (IR) communication port.

A computer system 500 may also include one or more input devices 511 and one or more output devices 513. Some examples of input devices 511 include a keyboard, mouse, microphone, remote control device, button, joystick, trackball, touchpad, and lightpen. Some examples of output devices 513 include a speaker and a printer. One specific type of output device that is typically included in a computer system 500 is a display device 515. Display devices 515 used with embodiments disclosed herein may utilize any suitable image projection technology, such as liquid crystal display (LCD), light-emitting diode (LED), gas plasma, electroluminescence, or the like. A display controller 517 may also be provided, for converting data 507 stored in the memory 503 into text, graphics, and/or moving images (as appropriate) shown on the display device 515.

The various components of the computer system 500 may be coupled together by one or more buses, which may include a power bus, a control signal bus, a status signal bus, a data bus, etc. For the sake of clarity, the various buses are illustrated in FIG. 5 as a bus system 519.

The techniques described herein may be implemented in hardware, software, firmware, or any combination thereof, unless specifically described as being implemented in a specific manner. Any features described as modules, components, or the like may also be implemented together in an integrated logic device or separately as discrete but interoperable logic devices. If implemented in software, the techniques may be realized at least in part by a non-transitory processor-readable storage medium comprising instructions that, when executed by at least one processor, perform one or more of the methods described herein. The instructions may be organized into routines, programs, objects, components, data structures, etc., which may perform particular tasks and/or implement particular data types, and which may be combined or distributed as desired in various embodiments.

The steps and/or actions of the methods described herein may be interchanged with one another without departing from the scope of the claims. In other words, unless a specific order of steps or actions is required for proper operation of the method that is being described, the order and/or use of specific steps and/or actions may be modified without departing from the scope of the claims.

The term "determining" encompasses a wide variety of actions and, therefore, "determining" can include calculating, computing, processing, deriving, investigating, looking up (e.g., looking up in a table, a database or another data structure), ascertaining and the like. Also, "determining" can include receiving (e.g., receiving information), accessing (e.g., accessing data in a memory) and the like. Also, "determining" can include resolving, selecting, choosing, establishing and the like.

The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. For example, any element or feature described in relation to an embodiment herein may be combinable with any element or feature of any other embodiment described herein, where compatible.

The present disclosure may be embodied in other specific forms without departing from its spirit or characteristics. The described embodiments are to be considered as illustrative and not restrictive. The scope of the disclosure is, therefore, indicated by the appended claims rather than by the foregoing description. Changes that come within the meaning and range of equivalency of the claims are to be embraced within their scope.

What is claimed is:

1. A method, comprising:
   accessing a plurality of bit rows from nodes of a memory block, wherein the memory block includes a digital memory block from a memory module having a plurality of memory blocks and an error correction code (ECC) memory block configured to correct errors within the plurality of memory blocks of the memory module;
   determining a row address for a set of sub-word line drivers accessing the plurality of bit rows; and
   generating a prefetch bit including a combination of the plurality of bit rows grouped within error correction regions of the prefetch bit, based on the determined row address for the set of sub-word line drivers,
   wherein:
   determining the row address comprises identifying a least significant bit (LSB) for the set of sub-word line drivers;
   generating the prefetch bit comprises grouping bits from the plurality of bit rows in an orientation within respective error correction regions based on the LSB for the set of sub-word line drivers; and
   grouping bits from the plurality of bit rows comprises multiplexing values of the plurality of bit rows into a pattern of bits based on the row address for the LSB in accordance with the correction scheme of the ECC memory block and so that sub-word line drivers do not span across the error correction regions.

2. The method of claim 1, further comprising providing the prefetch bit to a memory controller on a central processing unit (CPU) coupled to the memory module.

3. The method of claim 1, wherein determining the row address comprises determining that the set of sub-word line drivers is an even row in which no sub-word lines accessed by the sub-word line drivers intersect a fault line of input/output (I/O) pins of the memory block.

4. The method of claim 3, wherein generating the prefetch bit comprises, based on determining that the set of sub-word line drivers is an even row, orienting a pattern of bits of the prefetch bit in a burst line orientation in which the plurality of bit rows are mapped parallel to a boundary between a first correction region and a second correction region.

5. The method of claim 1, wherein determining the row address comprises determining that the set of sub-word line drivers is an odd row in which at least one sub-word line driver intersects a fault line of input/output (I/O) pins of the memory block.

6. The method of claim 5, wherein generating the prefetch bit comprises, based on determining that the set of sub-word line drivers is an odd row:
orienting a pattern of bits of the prefetch bit in a burst line orientation in which the plurality of bit rows are mapped parallel to a boundary between a first correction region and a second correction region; and
remapping one or more bit rows from the second correction region to first correction region such that none of the bit rows associated with the at least one sub-word line driver are distributed across the first correction region and the second correction region.

7. A method, comprising:
accessing a plurality of bit rows from nodes of a memory block, wherein the memory block includes a digital memory block from a memory module having a plurality of memory blocks and an error correction code (ECC) memory block configured to correct errors within the plurality of memory blocks of the memory module;
determining a row address for a set of sub-word line drivers accessing the plurality of bit rows; and
generating a prefetch bit including a combination of the plurality of bit rows grouped within error correction regions of the prefetch bit based on the determined row address for the set of sub-word line drivers, wherein groupings of the plurality of bits within the error correction regions are compatible with a correction scheme of the ECC memory block.

8. The method of claim 7, further comprising providing the prefetch bit to a memory controller on a central processing unit (CPU) coupled to the memory module.

9. The method of claim 7,
wherein determining the row address comprises identifying a least significant bit (LSB) for the set of sub-word line drivers, and
wherein generating the prefetch bit comprises grouping bits from the plurality of bit rows in an orientation within respective error correction regions based on the LSB for the set of sub-word line drivers.

10. The method of claim 9, wherein grouping bits from the plurality of bit rows comprises multiplexing values of the plurality of bit rows into a pattern of bits based on the row address for the LSB in accordance with the correction scheme of the ECC memory block.

11. The method of claim 7, wherein determining the row address comprises determining that the set of sub-word line drivers is an even row in which no sub-word lines accessed by the sub-word line drivers intersect a fault line of input/output (I/O) pins of the memory block.

12. The method of claim 11, wherein generating the prefetch bit comprises, based on determining that the set of sub-word line drivers is an even row, orienting a pattern of bits of the prefetch bit in a burst line orientation in which the plurality of bit rows are mapped parallel to a boundary between a first correction region and a second correction region.

13. The method of claim 7, wherein determining the row address comprises determining that the set of sub-word line drivers is an odd row in which at least one sub-word line driver intersects a fault line of input/output (I/O) pins of the memory block.

14. The method of claim 13, wherein generating the prefetch bit comprises, based on determining that the set of sub-word line drivers is an odd row:
orienting a pattern of bits of the prefetch bit in a burst line orientation in which the plurality of bit rows are mapped parallel to a boundary between a first correction region and a second correction region; and
remapping one or more bit rows from the second correction region to first correction region such that none of the bit rows associated with the at least one sub-word line driver are distributed across the first correction region and the second correction region.

15. The method of claim 7, wherein the memory module comprises a dual in-line memory module (DIMM), and wherein the plurality of memory blocks includes a plurality of dynamic random-access memory (DRAM) blocks, and wherein the prefetch bit comprises an 8×8 pattern of bits based on each DRAM block having eight input/output (I/O) ports.

16. A memory system, comprising:
a plurality of memory blocks, the plurality of memory blocks including a first plurality of dynamic random-access memory (DRAM) memory blocks and an error correction code (ECC) memory block housed within a dual-in line memory module (DIMM);
a plurality of sub-word line drivers implemented within a first memory block of the plurality of memory blocks, the plurality of sub-word line drivers including a set of sub-word line drivers configured to read a plurality of bit rows from nodes of the first memory block; and
an error correction manager including logic circuitry for generating a prefetch bit from the plurality of bit rows, wherein generating the prefetch bit comprises grouping the plurality of bit rows within error correction regions based on a determined row address for the set of sub-word line drivers and in accordance with a correction scheme employed by the ECC memory block.

17. The memory system of claim 16, wherein grouping the plurality of bit rows within error correction regions is based on a least significant bit (LSB) for the set of sub-word line drivers.

18. The memory system of claim 16, wherein the set of sub-word line drivers comprises an even row of sub-word line drivers positioned between nodes of the first memory block such that no sub-word lines accessed by each sub-word line driver of the set of sub-word line driver intersects a fault line of input/output (I/O) pins of the first memory block, and wherein generating the prefetch bit includes orienting a pattern of bits of the prefetch bit in a burst line orientation in which the plurality of bit rows are mapped parallel to a boundary between a first correction region and a second correction region.

19. The memory system of claim 16, wherein the set of sub-word line drivers comprises an odd row of sub-word line drivers positioned between nodes of the first memory block such that one or more word lines accessed by each sub-word line driver of the set of sub-word line drivers intersects a fault line of input/output (I/O) pins of the first memory block, and wherein generating the prefetch bit includes:
- orienting a pattern of bits of the prefetch bit in a burst line orientation in which the plurality of bit rows are mapped parallel to a boundary between a first correction region and a second correction region; and
- remapping one or more of bit rows from the second correction region to the first correction region such that none of the bit rows associated with the at least one sub-word line driver are distributed across the first correction region and the second correction region.

20. The memory system of claim 16, wherein the logic circuitry of the error correction manager includes one or more multiplexers for multiplexing values of the plurality of bit rows into a pattern of bits based on a row address for the set of sub-word line drivers in accordance with the correction scheme of the ECC memory block.

* * * * *